United States Patent [19]

Oota et al.

[11] Patent Number: 4,672,257

[45] Date of Patent: Jun. 9, 1987

[54] PIEZOELECTRIC LATCHING ACTUATOR HAVING AN IMPACT RECEIVING PROJECTILE

[75] Inventors: Takashi Oota; Tadao Uchikawa; Naoto Okihara; Yoshiki Aihara; Kazutoshi Wakamatsu, all of Tokyo, Japan

[73] Assignee: NEC Corporation, Japan

[21] Appl. No.: 820,603

[22] Filed: Jan. 21, 1986

[30] Foreign Application Priority Data

| | | | |
|---|---|---|---|
| Mar. 20, 1983 | [JP] | Japan | 60-57333 |
| Jan. 21, 1985 | [JP] | Japan | 60-8612 |
| Jan. 21, 1985 | [JP] | Japan | 60-8613 |
| Feb. 14, 1985 | [JP] | Japan | 60-27099 |
| Feb. 14, 1985 | [JP] | Japan | 60-271100 |
| Mar. 20, 1985 | [JP] | Japan | 60-57331 |
| Jul. 17, 1985 | [JP] | Japan | 60-158623 |
| Aug. 30, 1985 | [JP] | Japan | 60-192539 |
| Aug. 30, 1985 | [JP] | Japan | 60-192541 |
| Aug. 30, 1985 | [JP] | Japan | 60-192542 |

[51] Int. Cl.⁴ .............................................. H01L 41/08

[52] U.S. Cl. ..................................... 310/328; 200/181

[58] Field of Search ........................ 310/328, 330–332; 200/181

[56] References Cited

U.S. PATENT DOCUMENTS

| | | | |
|---|---|---|---|
| 2,587,482 | 2/1952 | Keller | 310/328 X |
| 2,800,551 | 7/1957 | Crownover | 310/332 |
| 2,916,578 | 12/1959 | Crownover | 310/328 X |
| 3,688,135 | 8/1972 | Koda et al. | 310/332 |
| 4,427,957 | 1/1984 | Sato | 200/181 |
| 4,454,442 | 6/1984 | Hosking | 310/328 |
| 4,458,171 | 7/1984 | Kolm et al. | 310/330 |
| 4,461,968 | 7/1984 | Kolm et al. | 310/332 |
| 4,538,087 | 8/1985 | Germano et al. | 310/332 |
| 4,553,061 | 11/1985 | Germano | 310/332 |

FOREIGN PATENT DOCUMENTS

| | | | |
|---|---|---|---|
| 783672 | 4/1968 | Canada | 200/181 |

*Primary Examiner*—Mark O. Budd

*Attorney, Agent, or Firm*—Laff, Whitesel, Conte & Saret

[57] ABSTRACT

Disclosed is a piezoelectric actuator comprising a pair of piezoelectric elements, bistable snap-action means, and projectile means attached to the snap-action means in an impact receiving relationship alternately with the piezoelectric elements. The projectile means has a mass sufficient to acquire an acceleration upon impact from each of the piezoelectric elements to cause the snap-action means to change state. The snap-action means may comprise an elongated bending element squeezed endwise between supports, the projectile means being carried by bending element at a point intermediate its ends.

20 Claims, 17 Drawing Figures

PIEZOELECTRIC LATCHING ACTUATOR HAVING AN IMPACT RECEIVING PROJECTILE

BACKGROUND OF THE INVENTION

The present invention relates to piezoelectric actuators, and more particularly to a piezoelectric latching actuator.

Electromagnetic actuators have been extensively used as relays due to their high switching performance and high voltage performance as compared with semiconductor counterparts. While electromagnetic relays have met with wide reception in various industrial applications, they still have a number of disadvantages in power consumption, heat loss and size due to the employment of excitation coil. Furthermore, magnetic flux generated by the coil tends to interfere with the operation of adjacent circuits.

Attempts have been made in recent years to utilize piezoelectric elements as a means for generating a driving force instead of the excitation coil. Piezoelectric elements are constructed of ceramic laminates of piezoelectric material. Two types of such laminates are in use. One is a bimorph element using a transverse piezoelectric effect which generates a displacement in a direction perpendicular to the direction of application of electric field, so that it bends in accordance with the applied field strength. The other is a multilayer element using a longitudinal piezoelectric effect which produces a displacement in a direction parallel to the direction of application of electric field, so that it expands in accordance with the applied field strength.

U.S. Pat. No. 4,383,195 issued to H. H. Kolm et al. discloses a piezoelectric snap actuator having piezoelectric bending elements of the bimorph type which are held in a curved configuration and a bistable snap-action layer sandwiched between the bending elements. Although satisfactory in terms of the amount of transverse displacement, the Kolm et al actuator is not energy efficient due to the transverse piezoelectric effect and a slow response due to the stress given to the piezoelectric elements by the curved configuration. A further disadvantage is that the displacement characteristic of the bimorph type actuator tends to vary with time if voltage is applied continuously.

On the other hand, the longitudinal effect piezoelectric element has a drawback in that the amount of its longitudinal displacement is much smaller than that obtained with the bimorph type element. While this problem may be solved by increasing the operating voltage, it exceeds the voltage limits of the associated actuator control circuitry. U.S. Pat. No. 4,454,442 issued to M. B. Hosking discloses a piezoelectric relay comprising a longitudinally expandable piezoelectric body and a single resilient elongate member of a dielectric material or a mechanical amplification means to amplify a minute dimensional change, typically a few micrometers, generated in the piezoelectric body for operating a relay contact. However, because of length limitations on the resilient member it is impossible to cause a relay contact to traverse between widely separated contacts.

SUMMARY OF THE INVENTION

It is therefore an object of the present invention to provide a piezoelectric actuator which is satisfactory for practical purposes.

This object is obtained by attaching a projectile member to a bistable snap-action means in an impact receiving relation with each of two piezoelectric elements.

Specifically, the piezoelectric actuator of this invention comprises a pair of piezoelectric elements, bistable snap-action means, and projectile means attached to the snap-action means in an impact receiving relationship alternately with the piezoelectric elements. The projectile means has a mass sufficient to acquire an acceleration upon impact from each of the piezoelectric elements to cause the snap-action means to change states.

The bistable snap-action means may comprises an elongated bending element squeezed endwise between supports, or a pivoted member having its free end movable between opposed magnetic poles, or a snap-action spring device of either pivotal or cantilever construction. For fabricating relays having low profile, it is preferred to use the elongated bending element.

BRIEF DESCRIPTION OF THE DRAWINGS

The present invention will be described in further detail with reference to the accompanying drawings, in which.

DETAILED DESCRIPTION

Figure 1:
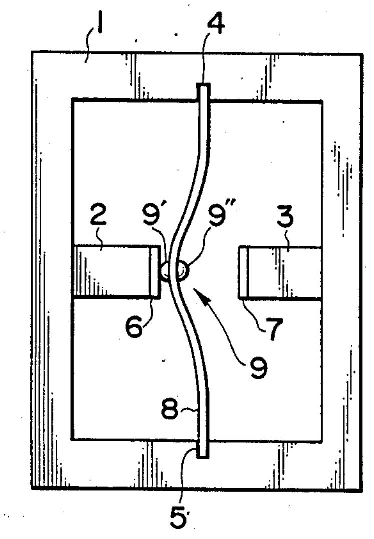
FIG. 1 shows a piezoelectric latching actuator constructed according to a first embodiment of the present invention employing a bistable snap-action device formed by a leaf spring squeezed endwise into a bow-like configuration.

In FIG. 1, there is shown a latching piezoelectric actuator constructed according to a first embodiment of the present invention. The actuator comprises an insulative support 1 of a framed construction and a pair of first and second piezoelectric elements 2 and 3 secured one on each side member of the frame in opposed relation to each other. Suitable means (not shown) are provided for individually exciting the piezoelectric elements. Support 1 is formed with notches 4 and 5 on the inside walls of the upper and lower limbs of the frame. To operate the actuator as a switching relay, piezoelectric elements 2 and 3 are provided with metal pieces 6 and 7 at their free ends. Metal pieces 6 and 7 provide dual functions of hammerheads and stationary contacts of the relay and are connected by lead wires, not shown, to an external circuit. An elongated thin springy metal strip or leaf spring 8, which is connected to the external circuit by a lead wire (not shown) is squeezed endwise between notches 4 and 5 so that it is curved into a bow-like configuration to establish a point contact with piezoelectric element 2 when the actuator is in a first stable state as shown in FIG. 1. Leaf spring 8 has a small round mass, or "projectile" 9 having part-spherical masses 9' and 9" secured one on each side of leaf spring 8. The projectile 9 acquires a sufficient acceleration on receiving impact from the hammerhead of each piezoelectric element to cause the spring 8 to spring back to the opposite side. Typically, the projectile 9 has a mass of 0.25 grams.

Piezoelectric elements 2 and 3 are preferably constructed of multilayered piezoelectric binary solid solution ceramics, $0.65Pb(Mg_{1/3}Nb_{2/3})O_3$-$0.35PbTiO_3$, having internal electrodes. Details of the fabrication of the piezoelectric element are described in an Article "Internal Electrode Piezoelectric Ceramic Actuator" by S. Takahashi et al, Ferroelectrics, Vol. 50, pages 181–190. For practical purposes, each piezoelectric element has a longitudinal dimension of 18 mm and a cross-section measuring 2 mm×3 mm.

In operation, a voltage pulse is applied to piezoelectric element 2. A minute dimensional change rapidly occurs in piezoelectric element 2 in response to the application of the voltage and applies a strong impact to moving contact 9 so that it acquires kinetic energy sufficient to cause the leaf spring to spring back to the opposite side. It has been found that a voltage of 150 volts is sufficient to drive the piezoelectric elements to obtain the necessary impact. Thus, moving contact 9 is brought into point contact with stationary contact 7 and the relay is switched in a second stable state. To restore the relay to the first stable state, a voltage pulse as applied to piezoelectric element 2 is applied to piezoelectric element 3.

Since piezoelectric elements have a capacitive nature, the application of long duration pulse is meaningless. A voltage pulse of typically 0.1-millisecond duration is sufficient to trigger the actuator. Since the actuator is bistable, the voltage pulse may be applied simultaneously to both piezoelectric elements rather than individually. The result is a small, low-power consumption actuator of simple construction having low heat loss and no magnetic interference. Throughout FIGS. 2 to 9, like parts have been given like numbers accompanied by successive lower case letters.

Figure 2:
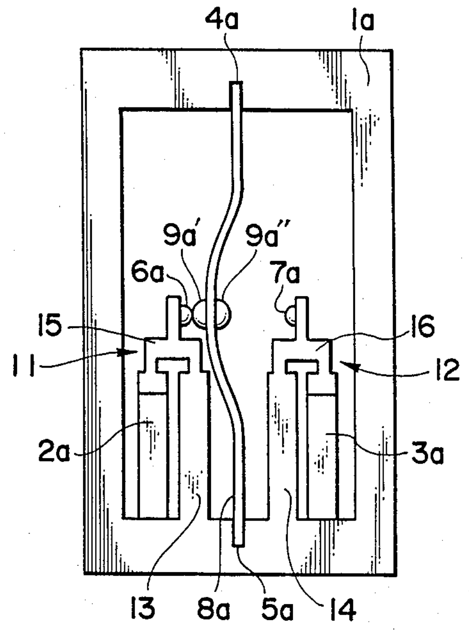
FIG. 2 shows a modified form of the embodimen of FIG. 1 employing lever means for altering the application of impact to the projectile.

In another form shown at FIG. 2, the actuator comprises a pair of lever means 11 and 12 which may be integrally formed with the insulative support 1*a*. Lever means 11 and 12 have lower, base portions 13 and 14, respectively, and upper, contact carrying portions 15 and 16 where stationary contacts 6*a* and 7*a* are provided. Piezoelectric element 2*a* is secured in position between the upper portion 15 of the lever 11 and the lower limb of support 1*a* so that it applies impact when excited in a direction parallel with the base portion 13. Piezoelectric element 3*a* is likewise secured between the upper portion 16 of lever 12 and the lower support limb to apply impact in a direction parallel with the base portion 14 of lever 12. Excitation of each piezoelectric element causes the base portion of the associated lever means to rotate at a point adjacent the lower limb of support 1*a*. As a result, the impact generated by each piezoelectric element is changed in direction by 90 degrees to the horizontal. This arrangement results in an actuator having a smaller transverse dimension than the longtudinal dimension.

Figure 3:
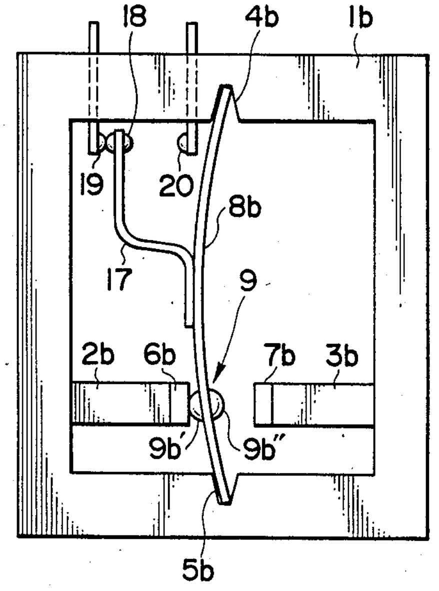
FIG. 3 shows a second modification of the first embodiment a separate arm carrying a moving contact in relation to stationary contacts to operate the actuator as a relay.

In a second modified form of the embodiment of FIG. 1, leaf spring 8*b* has a concentrated mass 9 at an off-center point as shown in FIG. 3 and make contact with piezoelectric elements 2*b* and 3*b* which are likewise located off center of the longitudinal dimension of the actuator. To the center portion of leaf spring 8*b* is secured an arm 17 of a springy material having a moving contact 18. Moving contact 18 has a sufficient contact area with stationary contacts 19 and 20 on the upper limb of support 1*b* to provide a low impedance path. The moving contact 18 travels a distance a few hundred times greater than the dimensional change of the piezoelectric elements. Arm 17 has such a resiliency lower than the resiliency of leaf spring 8*b* so that it minimizes contact wear.

Figure 4:
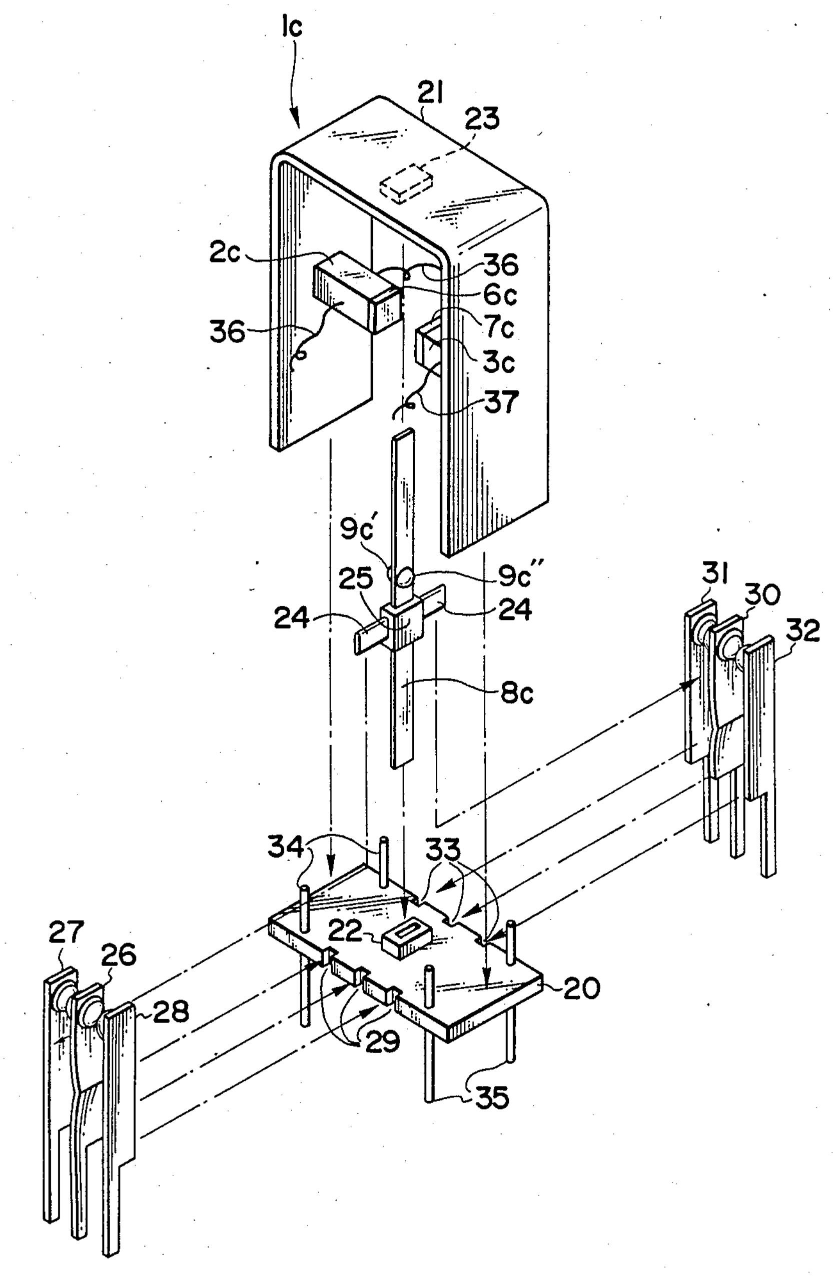
FIG. 4 is an exploded, perspective view of a third modification of the first embodiment suitable for operation as a multicontact relay.

A fourth modification of the FIG. 1 embodiment is shown in FIG. 4. In this modification, support 1*c* comprises a base 20 and an upper, inverted U-shaped frame 21 to the side walls of which piezoelectric elements 2*c* and 3*c* are secured. On the base 20 is provided a spring mount 22 in which the lower end of leaf spring 8*c* is engaged. The upper end of leaf spring 8*c* engages with a spring mount 23 provided on the top wall of upper support frame 21 so that the leaf spring 8*c* is squeezed endwise between mounts 22 and 23. To the Leaf spring 8*c* are connected horizontal bars 24 by a coupling block 25. Two sets of contacts arms are provided; one set comprises a moving contact arm 26 and a pair of stationary contact arms 27 and 28, the arms 26 to 28 being engaged with notches 29 on base 20 and a second set comprises a moving contact arm 30 and a pair of stationary contact arms 31 and 32 which are engaged in notches 33. Horizontal arm 24 extends into the space between moving contact arm 26 and stationary contact arm 27 and into the space between moving contact arm 30 and stationary contact arm 31. Each of the contact arms has a leg around which a conductor is to be wrapped around. Voltages are applied to pins 34 and 35 which are connected to piezoelectric elements 2*c*, 3*c* by conductors 36, 37. With the actuator being in the first stable state, moving arms 26, 30 are in contact with stationary contact arms 27, 31, respectively.

Upon excitation of piezoelectric element 2*c*, leaf spring 8*c* springs back to piezoelectric element 3*c* with a force sufficient to overcome the combined spring force of moving contact arms 26 and 30, so that horizontal bars 24 disengage them from stationary contact arms 27 and 31 and engage them with stationary contact arms 28 and 32, respectively, whereby the relay is switched to a second stable state. The relay is switched back to the first stable state by exciting piezoelectric element *3c*. In this case, leaf spring 8*c* springs back to piezoelectric element 2*c* without encoutering counteractive force and moving contacts 26, 30 return to the original positions with their own returning force. This embodiment results in a relay having a large number of contacts with reduced connecting wires and a simplified structure for ease of manufacture.

Figure 5:
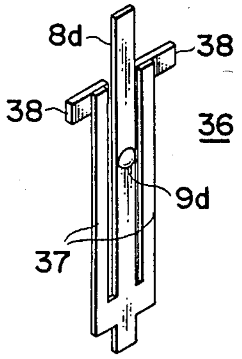
FIG. 5 is an illustration of a leaf spring which can also be used in the actuator of FIG. 4.
Figure 5A:
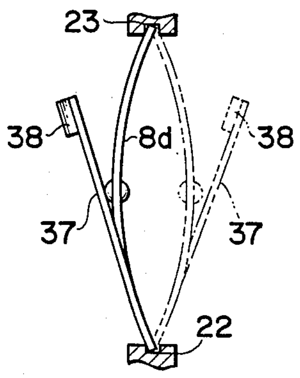
FIG. 5*a* is a side view useful for describing the operation of the leaf spring.

FIG. 5 is an illustration of a modified form of leaf spring designated 8*d*. Leaf spring 8*d* forms a center part of a spring assembly 36 which includes a pair of vertical members 37 which are connected at their base to the lower end portion of leaf spring 8*d* and a pair of horizontal bars 38 extending respectively from the upper ends of the vertical members 37. Leaf spring 8*d* is squeezed endwise between spring mounts 22 and 23 in a curved configuration as shown in FIG. 5*a*, with horizonal bars 38 extending between the moving contact arms 26, 30 and stationary contact arms 27, 31. Since vertical members 37 extend straight, the horizontal bars 38 are positioned leftwardly of the curved leaf spring 8*d*. When the leaf spring is switched to the right as indicated by a dotted-line, horizontal bars 38 are positioned rightwardly of the leaf spring. As a result, the horizontal bars 38 can travel a distance larger than the distance travelled by the projectile 9.

Figure 6:
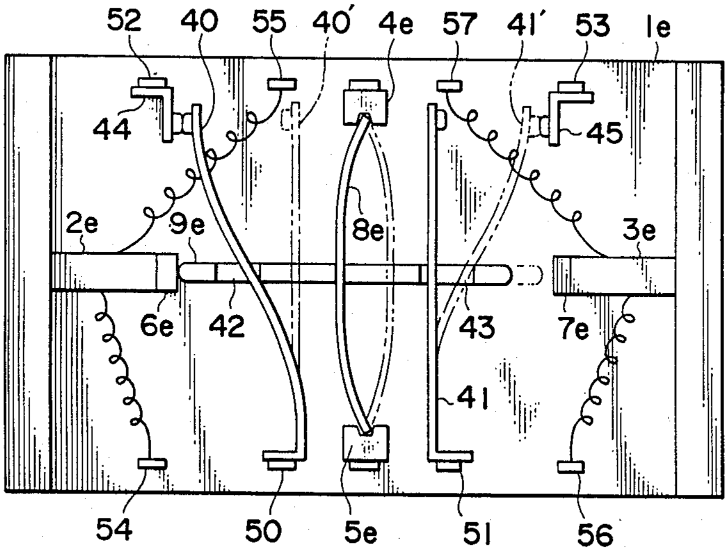
FIG. 6 shows a fourth modification of the first embodiment using elongated projectile for moving a plurality of moving contact arms.

A further modified embodiment of the invention is illustrated in FIG. 6. This embodiment results in a relay having a low profile which is advantageous for stacking a number of relays into a single unit. Leaf spring 8*e* is squeezed endwise between supports 4*e* and 5*e*. Projectile 9*e* is in the form of an elongated member having slots 42 and 43 and extends in the longitudinal direction of the support base 1*e*. First and second moving contacts 40 and 41, respectively connected at their ends to terminals 50 and 51, extend at right angles to the projectile 9*e* and pass through its slots 42 and 43. When projectile 9*e* is positioned to the left as indicated by solid-line, first moving contact arm 40 is urged to the left into contact with a stationary contact 44 and second moving contact arm 41 extends straight to a position spaced from a stationary contact 45. When projectile 9*e* is positioned to the right, first moving contact arm 40 is moved away from stationary contact 44 to a position indicated by a broken-line 40' and second moving contact arm 41 is brought into contact with stationary contact 45 as indicated by a broken-line 41'. Adjacent to the opposite ends of projectile 9*e* are located piezoelectric elements 2*e* and 3*e*, respectively. By excitation of each piezoelectric element, the relay can be switched from one stable state to the other. Terminals 50 and 51 extends downwardly of the base 1*e* for connection to an external circuit. Stationary contacts 44 and 45 are connected to terminals 52 and 53 which likewise extend downwardly of the base for connection to the external circuit. Piezoelectric elements are excited by voltages supplied to terminals 54–57 through lead wires which lie on the underside of base le as indicated by dotted spiral lines. The parallel arrangement of the leaf spring and moving contact arms to the supporting base 1*e* results in a flat relay.

Figure 7:
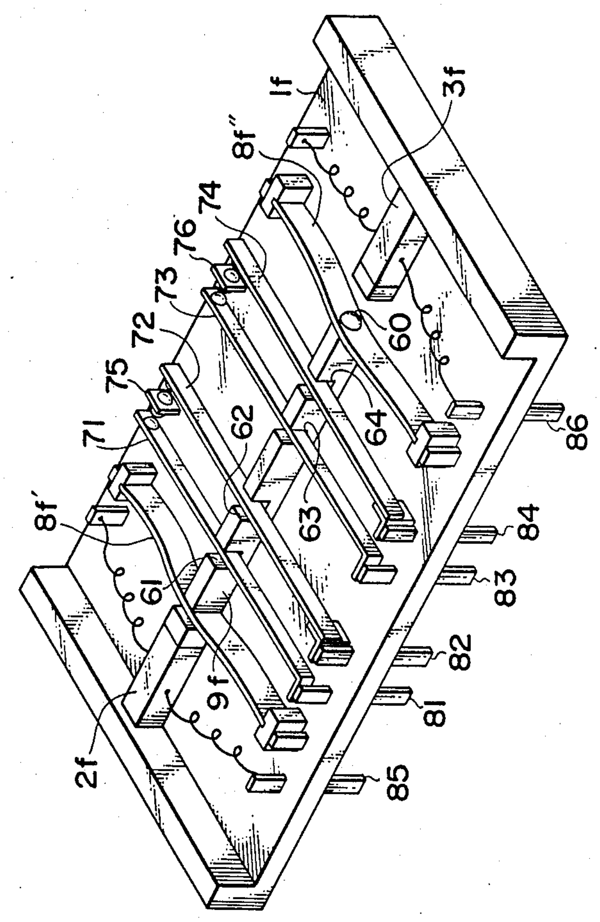
FIG. 7 shows a fifth modification of the first embodiment in which a pair of leaf springs is provided for moving a plurality of moving contact arms.

The embodiment of FIG. 6 is modified to increase the number of relay contact pairs to realize a flat-type, multi-contact relay. FIG. 7 shows one example of such relays. This relay has a pair of leaf springs 8*f'* and 8*f''* which run parallel to each other and are connected together by a projectile 9*f* of an elongated member. Each leaf spring has a small round metal or impact receiving member 60 which forms part of the projectile 9*f*. Piezoelectric elements 2*f* and 3*f* are located adjacent the impact receiving members 60 in alignment with the projectile 9*f*. Projectile 9*f* is formed with a plurality of slots 61–64 for receiving a like plurality of moving contact arms 71–74, respectively. Moving contact arms 71–74 have their fixed ends connected to terminals 81–84, respectively, which extend downwardly of base 1*f* for connection to external circuit. The free ends of the moving contact arms are positioned relative to stationary contacts 75 and 76. When piezoelectric element 2*f* is excited by a voltage applied to terminal 85, projectile 9*f* is impacted with a sufficient acceleration to cause leaf springs 8*f'* and 8*f''* to spring back to their opposite side. Likewise, when piezoelectric element 3*f* is excited by a voltage applied to terminal 86, leaf projectile 9*f* is impacted with a sufficient acceleration to cause leaf springs 8*f'* and 8*f''* to spring back in a direction toward piezoelectric element 2*f*.

Figure 8:
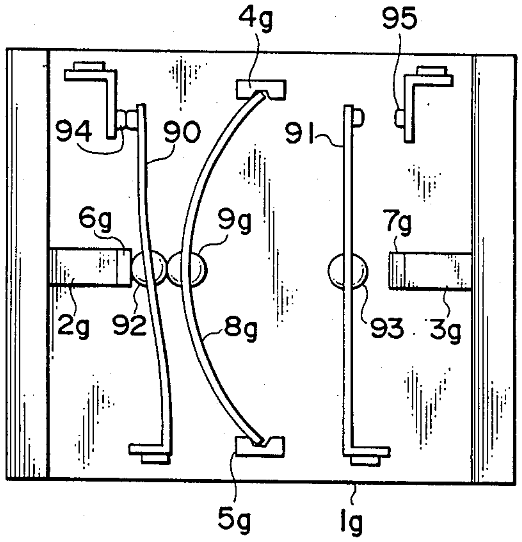
FIG. 8 shows a sixth modification of the first embodiment employing impact transfer means carried by moving contact arms for transferring impact received from piezoelectric elements to the projectile.

The embodiment shown in FIG. 8 is a further modification of the invention in which moving contact arms 90 and 91 are provided with projectiles 92 and 93, respectively, which are adapted for receiving impact from piezoelectric elements 2*g* and 3*g*, respectively. Leaf spring 8*g* is located between the moving contacts 90 and 91 so that its projectile 9*g* receives impact from each of the projectiles 92 and 93. Stationary contacts 94 and 95 are arranged to make contact with moving contact arms 90 and 91, respectively. The relay is in a first stable state when leaf spring 8*g* is curved to the left as shown to urge the moving contact arm 90 into pressure contact with the piezoelectric element 2*g* to establish contact between moving contact arm 90 and stationary contact 94. Upon excitation of piezoelectric element 2*g*, projectile 92 receives impact from the hammerhead 6*g* and this impact is transferred to the projectile 9*g*, causing leaf spring 8*g* to be sprung back to the other side. Leaf spring 8*g* urges the moving contact arm 91 into contact with piezoelectric element 3*g* to establish contact between it and stationary contact 95. When piezoelectric element 3*g* is excited with leaf spring 8*g* being curved to the right, the projectile 93 acts as an intermediary impact receiving member to transfer the kinetic energy of piezoelectric element 3*g* to the projectile 9*g*.

Figure 9:
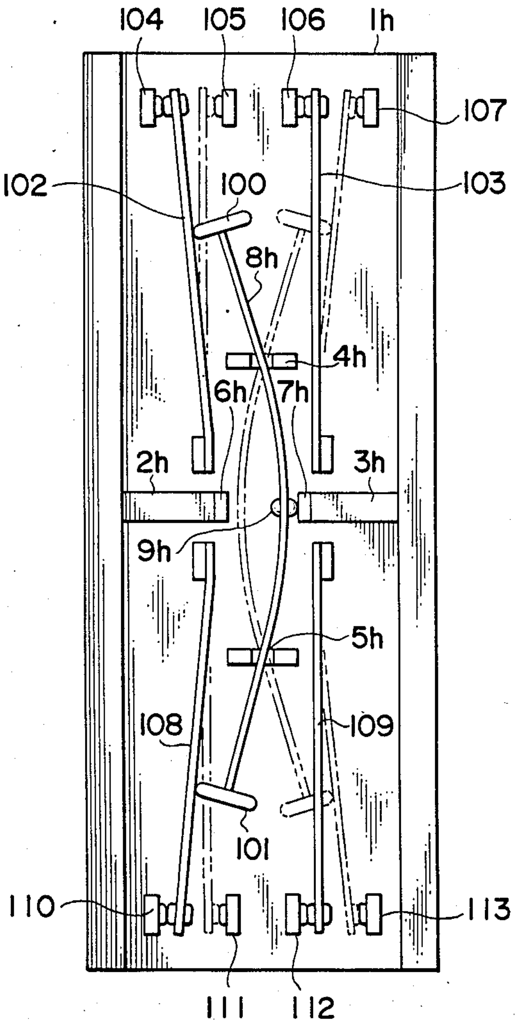
FIG. 9 shows a seventh modification of the first embodiment employing a pair of a hammerheads attached to the opposite ends of the leaf spring for operating a plurality of moving contact arms.

In a further modification, FIG. 9, leaf spring 8*h* is pivotally supported by spring mounts 4*h* and 5*h* at intermediate points and provided with hammerheads 100 and 101 at the opposite ends thereof. Moving contact arms 102 and 103 are arranged to be alternately urged by the hammerhead 100 so that moving contact 102 is alternately switched between stationary contacts 104 and 105 and moving contact 103 is switched between stationary contacts 106 and 107. Likewise, moving contact arms 108 and 109 are arranged to be alternately urged by the hammerhead 101 so that moving contact 108 is alternately switched between stationary contacts 110 and 111 and moving contact 109 is switched between stationary contacts 112 and 113. With the relay being in a first stable state, leaf spring 8*h* is curved to the right as indicated by solid lines, engaging its projectile 9*h* into contact with piezoelectric element 3*h*, and moving contact arms 102 and 108 are urged to the left by hammerheads 100 and 101 to establish contact with stationary contacts 104 and 110, respectively, and moving contact arms 103 and 109 are allowed to contact with stationary contacts 106 and 112. Upon excitation of piezoelectric element 3*h*, spring mounts 4*h* and 5*h* act as pivots for the leaf spring to spring back to the left. Moving contact arms 103 and 109 are urged by hammerheads 100 and 101 into contact with stationary contacts 107 and 113 and moving contact arms 102 and 108 are allowed to engage with stationary contacts 105 and 111 as indicated by broken lines.

Figure 10:
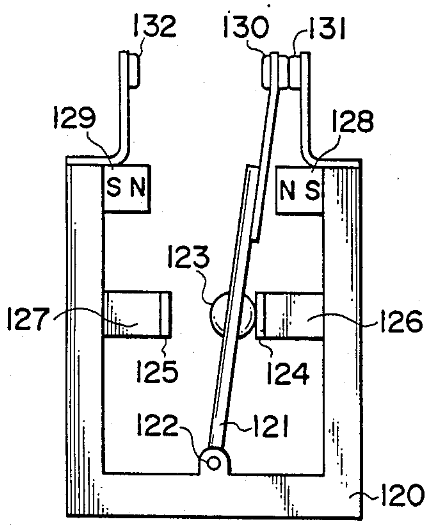
FIG. 10 shows a piezoelectric latching actuator constructed as a relay according to a second embodiment of the present invention wherein the bistable snap-action device is formed by flux generating means.
Figure 11:
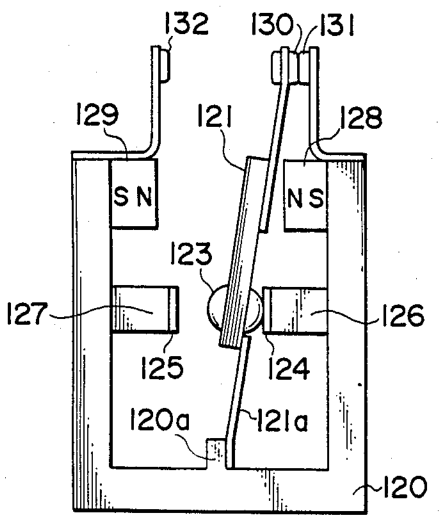
FIGS. 11 and 12 show modified forms of the second embodiment.
Figure 12:
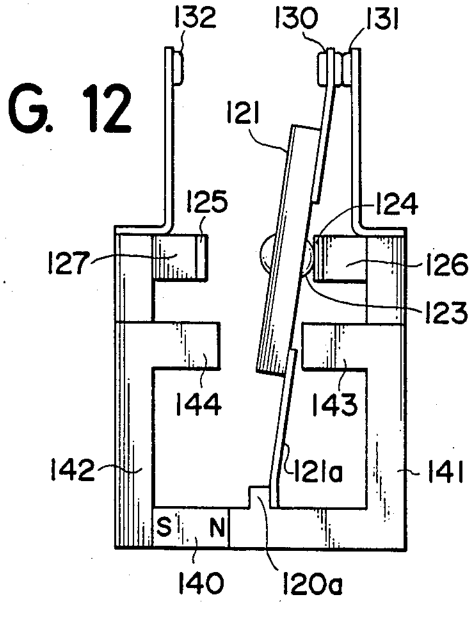

FIG. 10 shows a second embodiment of the present invention. The actuator comprises a U-shaped support 120 and a bar 121 of ferromagnetic material pivotally supported at 122 on the web portion of the support. Bar 121 has a projectile 123 which is adapted to receive impact either from hammerheads 124 and 125 which are attached to free ends of piezoelectric elements 126 and 127 which are in turn secured to intermediate points of the limbs of the U-shaped support 120. Permanent magnets 128 and 129 are fixed to the end portions of the support limbs so that magnet 128 attracts the pivoted bar 121 when tilted rightwardly to the vertical and magnet 129 also attracts bar 121 when tilted leftwardly to the vertical. With the bar 121 being attracted to the right, the application of a voltage to piezoelectric element 126 causes projectile 123 to receive impact from hammerhead 124 and acquires an acceleration sufficient to overcome the force of attraction exerted thereon by permanent magnet 128 and moves past the vertical. Bar 121 is thus attracted by permanent magnet 129 and latched in position until piezoelectric element 127 is excited to repeat the process in reverse direction. The actuator can be made to operate as a relay by providing a moving contact 130 to the bar 121 and stationary contacts 131 and 132 adjacent the magnets 128 and 129, respectively. By forming the bar 121 with a nonconductive ferromagnetic material, the projectile 123 may serve as a moving contact and hammerheads 124 and 125 as stationary contacts, as in the embodiment of FIG. 1. As shown in FIG. 11, the pivot portion of bar 121 may be replaced with a leaf spring 121*a* secured to a support 120*a*. The relay may be altered to include a single permanent magnet 140 as shown in FIG. 12. In this case, magnet 140 forms part of a generally U-shaped support with ferromagnetic members, or cores 141 and 142 with poles 143 and 144 located in positions lower than the positions of piezoelectric elements 126 and 127.

Figure 13:
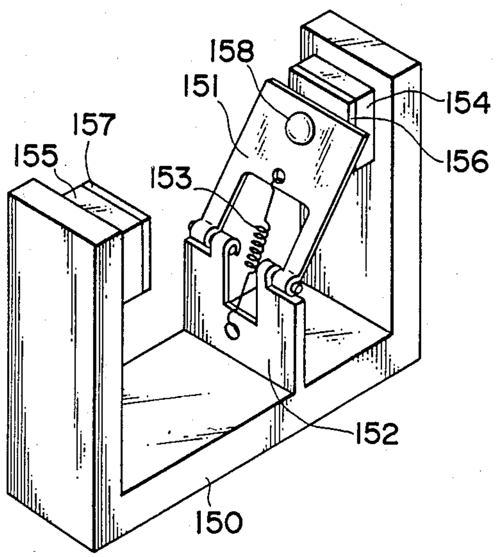
FIG. 13 shows a piezoelectric latching actuator according to a third embodiment of the present invention in which the bistable snap-action device comprises a spring mechanism.
Figure 14:
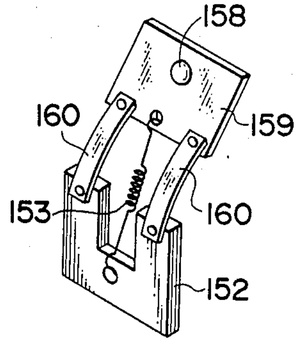
FIGS. 14 to 16 show modified forms of the third embodiment.
Figure 15:
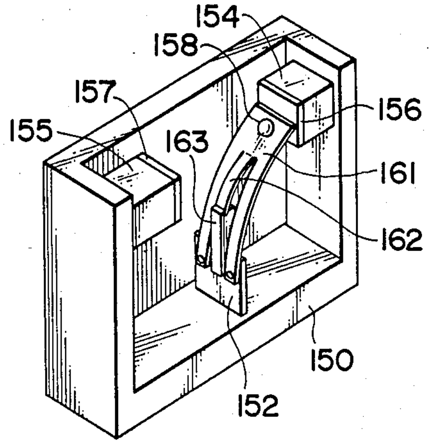

FIGS. 13 to 16 are illustrations of further alternative forms of the present invention. In FIG. 13, the support is of a U-shaped construction as shown at 150 and the leaf spring is replaced with an inverted U-shaped, latching member 151 with its limbs pivoted on a base 152. A coil spring 153 is connected between the web portion of latching member 151 and base 152 to urge the latching member 151 to either of its sides. Piezoelectric elements 154 and 155 are secured to the inside walls of the limbs of the U-shaped support 150. Latching member 151 has a projectile 158 which is made to contact with a hammerhead 156 fitted to piezoelectric element 154 when it is tilted thereto or hammerhead 157 of piezoelectric element 155 when tilted to the opposite side. As in the FIG. 1 embodiment, projectile 158 may act as a moving contact and hammerheads 156 anmd 157 as stationary contacts. As shown in FIG. 14, the pivoted member 151 may be replaced with a plate 159 and a pair of leaf springs 160 coupling it to the base 152. As illustrated in FIG. 15, latching member 151 and spring 153 may be replaced with a cantilever spring 161 having a leaf spring 162 extending from it to engage with a stationary member 163 fitted to base 152 to cause the cantilever spring 16 to take the shape of a curve toward piezoelectric member 154. Upon receiving impact from hammerhead 156, cantilever spring 161 snaps to opposite side and leaf spring 16 comes to a position opposite to the previous position to hold the cantilever spring in pressure contact with hammerhead 157.

Figure 16:
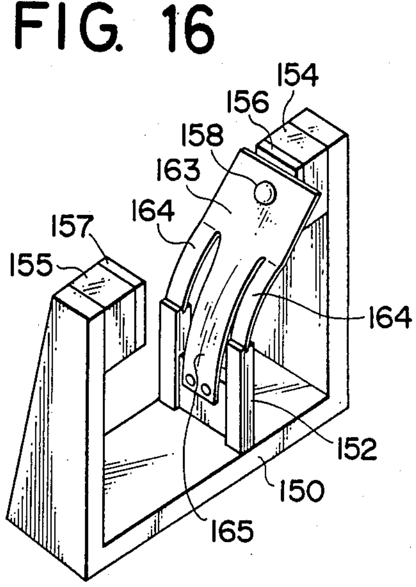

Alternatively as shown in FIG. 16, latching member may comprises a leaf spring 163 having a pair of side limbs 164 which are secured at lower ends to base 152 and curved to one side. Leaf spring 163 has a center limb 165 which is also secured to base 152 but bent in a direction opposite to the direction of bend of limbs 164.

What is claimed is:

1. A piezoelectric actuator comprising:

a pair of elongated piezoelectric elements, each of said elements being secured at one end to a support and being formed of multilayered ceramics for generating a rapidly varying displacement in a longitudinal direction thereof when an electrical potential is applied thereto;

bistable snap-action means; and projectile means attached to said snap-action means in an impact receiving relationship for alternately engaging an end which is opposite said one end on each one of said piezoelectric elements, said projectile means having a mass which is sufficient to acquire an acceleration responsive to receiving an impact from each of said piezoelectric elements to cause said snap-action means to change state.

2. A piezoelectric actuator as claimed in claim 1, wherein said snap-action means comprises spring means.

3. A piezoelectric actuator as claimed in claim 2, wherein said spring means comprises an elongated bending element squeezed endwise on a support to assume a curve representing a bistable state.

4. A piezoelectric actuator as claimed in claim 1, further comprising hammerhead means attached to each of said piezoelectric elements in an impact transfer relationship from the piezoelectric element to said projectile means.

5. A piezoelectric actuator as claimed in claim 1, wherein said opposite ends of said piezoelectric elements are in an opposed relationship with respect to each other, said projectile means being located between said opposite ends of said piezoelectric elements.

6. A piezoelectric actuator as claimed in claim 3, further comprising a flexible contact arm secured to said elongated bending element for cooperating with a stationary contact in response to the bending element changing state.

7. A piezoelectric actuator as claimed in claim 3, further comprising a pair of flexible contact arms, wherein said elongated bending element is provided with a cross arm for urging said flexible contact arms to cooperate with stationary contacts.

8. A piezoelectric actuator as claimed in claim 3, wherein said projectile means comprises an elongated member extending perpendicularly to said elongated bending element, said elongated member having opposite ends in an impact receiving relationship with said piezoelectric elements respectively, further comprising flexible contact arms engaged with said elongated projectile member for cooperating with stationary contacts in response to said bending element changing state.

9. A piezoelectric actuator as claimed in claim 2, further comprising a first pair of flexible contact arms and a second pair of flexible contact arms, wherein said spring means comprises an elongated bending element squeezed endwise between pivot points which are located intermediate the opposite ends of said elongated bending element, a first hammerhead means fitted to one end of said elongated bending element for alternately urging the flexible contact arms of said first pair and a second hammerhead means fitted to the other end of said elongated bending element for alternately urging the flexible contact arms of said second pair.

10. A piezoelectric actuator as claimed in claim 1, wherein said snap-action means comprises magnetic flux generating means for defining a pair of magnetic poles and a pivotally movable member of magnetic material pivoted at one end thereof so that the free end thereof is movable between said magnetic poles, said projectile means being carried by said pivotally movable member for moving it between said poles upon receiving impact from each of said piezoelectric elements.

11. A piezoelectric actuator as claimed in claim 10, wherein said flux generating means comprises a pair of permanent magnets.

12. A piezoelectric actuator as claimed in claim 10, wherein said flux generating means comprises a permanent magnet and yoke means connected to said magnet to define said poles.

13. A piezoelectric actuator as claimed in claim 2, wherein said spring means comprises a pivotally swingable member pivoted at one end thereof carrying said projectile means and a spring connecting said pivotally movable member to a support so that said pivotally swingable member can be tilted to either side thereof by said spring to allow said projectile means to establish said impact receiving relationship with each of said piezoelectric elements.

14. A piezoelectric actuator as claimed in claim 2, wherein said spring means comprises a cantilever spring carrying said projectile means, said cantilever spring having a leaf spring integrally formed therewith and extending therefrom to engage with a stationary support to cause said cantilever spring to take the shape of a curve.

15. A piezoelectric actuator comprising:

a pair of piezoelectric elements, said piezoelectric elements being located parallel to each other for generating an impact in one direction, further comprising a pair of lever means for altering the direction of impact generated by each of said piezoelectric elements;

bistable snap-action means; and projectile means attached to said snap-action means in an impact receiving relationship for altermately engaging said piezoelectric elements, said projectile means having a mass which is sufficient to acquire an acceleration upon impact from each of said piezoelectric elements to cause said snap-action means to change state.

16. A piezoelectric actuator comprising:

a pair of piezoelectric elements;

bistable snap-action spring means having an elongated bending element squeezed endwise on a support to assume a curve representing a bistable state, a pair of flexible contact arms, wherein said elongated bending element is provided with a pair of limbs extending from one end portion of said elongated bending element, the free ends of said limbs having lateral extensions for urging said flexible contact arms to cooperate with stationary contacts; and projectile means attached to said snap-action means in an impact receiving relationship for altermately engaging said piezoelectric elements, said projectile means having a mass which is sufficient to acquire an acceleration upon impact from each of said piezoelectric elements to cause said snap-action means to change state.

17. A piezoelectric actuator comprising:

a pair of piezoelectric elements;

bistable snap-action spring means comprising a pair of first and second elongated bending elements, each of said bending elements being squeezed endwise on a support, said elongated bending elements being spaced from each other and located between said piezoelectric elements; and projectile means attached to said snap-action means in an impact receiving relationship for alternately engaging said piezoelectric elements, said projectile means having a mass which is sufficient to acquire an acceleration upon impact from each of said piezoelectric elements to cause said snap-action means to change state, said projectile means further comprising an elongated projectile member attached at opposite ends to said first and second elongated bending elements, and a pair of impact receiving portions respectively attached to said bending elements in an impact receiving relationship with said piezoelectric elements, said projectile means still further comprising a plurality of flexible contact arms extending to right angles to and engaging said elongated projectile member for cooperating with stationary contacts in response to said bending element changing state.

18. A piezoelectric actuator comprising:

a pair of piezoelectric elements;

bistable snap-action spring means, said spring means comprises an elongated bending element squeezed endwise on a support to assume a curve representing a bistable state; and projectile means attached to said snap-action means in an impact receiving relationship for alternately engaging said piezoelectric elements, said projectile means having a mass which is sufficient to acquire an acceleration upon impact from each of said piezoelectric elements to cause said snap-action means to change state, a pair of flexible contact arm located one on each side of said elongated bending element, each of said flexible contact arms having an impact transfer menas in an impact receiving relationship with an associated one of said piezoelectric elements and in impact transfer relationship with said projectile means.

19. A relay comprising:

a pair of piezoelectric elements, each of said elements being secured at one end to a support and being formed of multilayered ceramics for generating a rapidly varying displacement in a longitudinal direction thereof in response to an electrical pulse applied thereto;

bistable snap-action means;

projectile means attached to said snap-action means for movement therewith and located in an impact receiving relationship for alternately engaging an end opposite said one end of each one of said piezoelectric elements, said projectile means having a mass which is sufficient to acquire an acceleration upon receiving an impact from each of said piezoelectric elements to cause said snap-action means to change state; and a flexible contact arm carrying a moving contact for cooperating with a stationary contact in response to said snap-action device changing state.

20. A relay comprising:

a pair of elongated piezoelectric elements, each of said elements being secured at one end to a support and being formed of multilayered ceramics for generating a rapidly varying displacement in a longitudinal direction thereof in response to an electrical pulse applied thereto;

a bistable bending element squeezed endwise;

an elongated projectile extending perpendicularly to and being attached to said bending element for movement therewith, said projectile having opposite ends located in an impact receiving relationship for alternately engaging an end opposite said one end of each one of said piezoelectric elements, said projectile having a mass which is sufficient to acquire an acceleration upon receiving an impact from each of said piezoelectric elements to cause said bending element to change state; and a plurality of flexible arms carrying moving contacts for cooperating with associated stationary contacts in response to said bending element changing state.

* * * * *